United States Patent
Yoshida

[11] Patent Number: 6,057,190
[45] Date of Patent: May 2, 2000

[54] METHOD OF MANUFACTURING SEMICONDUCTOR DEVICE

[75] Inventor: Naoyuki Yoshida, Tokyo, Japan

[73] Assignee: NEC Corporation, Japan

[21] Appl. No.: 08/880,989

[22] Filed: Jun. 23, 1997

[30]    Foreign Application Priority Data

Jun. 24, 1996  [JP]  Japan ..................... 8-162867

[51] Int. Cl.[7] ............................................. H01L 21/8242
[52] U.S. Cl. .......................................... 438/254; 438/397
[58] Field of Search .................................. 438/238, 239, 438/253, 254, 396, 397

[56]                References Cited

U.S. PATENT DOCUMENTS

5,849,619   12/1998   Cho et al. ............................... 438/254

FOREIGN PATENT DOCUMENTS

| 62-48062 | 3/1987 | Japan . |
| 4-266060 | 9/1992 | Japan . |
| 71-61834 | 6/1995 | Japan . |
| 9181278 | 7/1997 | Japan . |

Primary Examiner—Joni Chang

[57]                ABSTRACT

In a semiconductor device manufacturing method, a first insulating film is formed on a semiconductor substrate. A contact hole is selectively formed in the first insulating film. A first conductive film is formed on the first insulating film to fill the interior of the contact hole. A second insulating film is formed on the first conductive film. A second conductive film is formed on the second insulating film. The second insulating film and the second conductive film are patterned to leave the second insulating film and the second conductive film only immediately above the contact hole. A third conductive film is formed on the surfaces of the first conductive film, the second insulating film, and the second conductive film. The third conductive film on the first and second conductive films is removed to form a cylindrical lower electrode consisting of the third conductive film left only on the side surfaces of the second insulating film and the second conductive film. An exposed portion of the first conductive film and the second conductive film are removed to expose the first and second insulating films. The second insulating film is removed to expose the first conductive film. A third insulating film and a fourth insulating film serving as an upper electrode are formed.

8 Claims, 9 Drawing Sheets

METHOD OF MANUFACTURING SEMICONDUCTOR DEVICE

BACKGROUND OF THE INVENTION

The present invention relates to a method of manufacturing a semiconductor device and, more specifically, to a method of manufacturing a stacked dynamic RAM (Random Access Memory).

Recently, with the increases in integration degrees of LSIs, dynamic RAMs (to be referred to as DRAMs hereinafter) have been micropatterned. However, if the area (capacitor area) of a portion which contributes to the capacitance of a memory cell capacitor is greatly decreased, the capacitance becomes too small to detect the accumulated electric charge. To increase the capacitor area per unit area, a memory cell having a cylinder-stacked structure has been proposed.

Figure 6A:
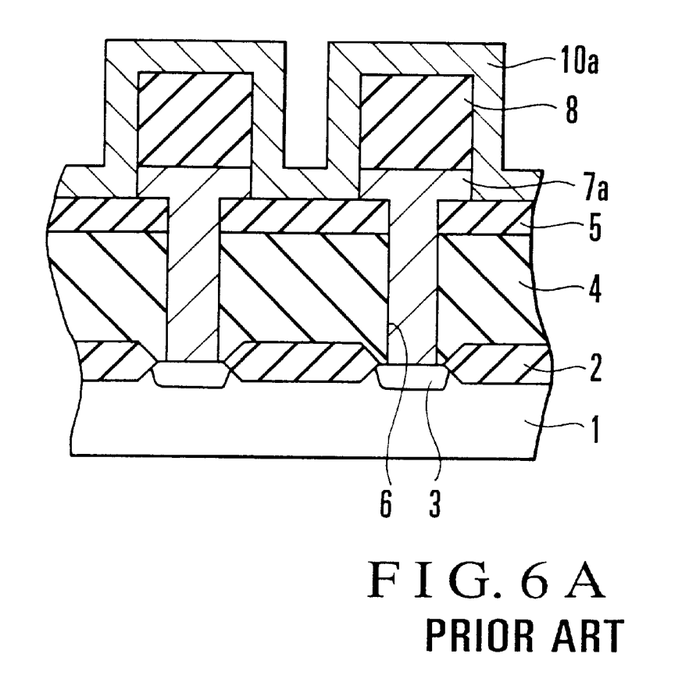
FIGS. 6A to 6D are sectional views, respectively, showing the steps in manufacturing a conventional semiconductor device.

A conventional method of manufacturing a DRAM having a cylinder-stacked structure will be described below with reference to FIGS. 6A to 6D. As shown in FIG. 6A, a 0.4-$\mu$m thick field oxide film 2 is formed on the surface of a p-type silicon substrate 1 by selective oxidation to partition active regions. A gate oxide film (not shown), a gate electrode (not shown), a source region 3, and a drain region (not shown) are formed in each active region to form a memory cell transistor with a known structure.

A 1-$\mu$m thick BPSG (BoroPhosphoSilicate Glass) film 4 is formed on the silicon substrate 1 including the field oxide film 2, and a 0.2-$\mu$m thick silicon oxide film 5 is formed on the BPSG film 4. Using lithography and etching, a contact hole 6 about 0.4 $\mu$m square is formed in the BPSG film 4 and the silicon oxide film 5 to reach the source region 3. A 0.2-$\mu$m thick polysilicon film 7 is formed on the silicon oxide film 5, and the interior of the contact hole 6 is filled with a polysilicon film 7a. A 0.4-$\mu$m thick BPSG film 8 is formed on the polysilicon film 7a.

Using lithography and etching, the polysilicon film 7a and the BPSG film 8 are patterned to leave the polysilicon film 7a and the BPSG film 8 above the contact hole 6 including a peripheral portion. A 0.2-$\mu$m thick polysilicon film 10a is formed on the silicon oxide film 5 and the BPSG film 8. FIG. 6A shows a state wherein the polysilicon film 10a is formed.

Figure 6B:
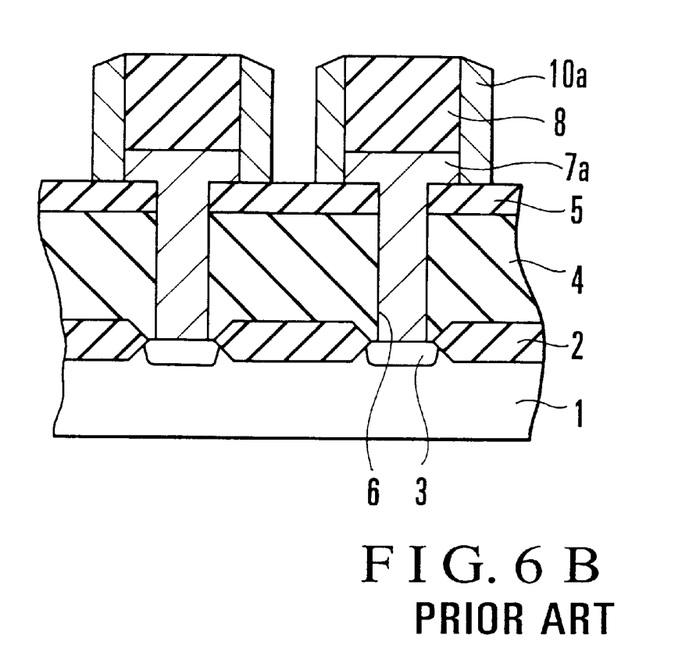
Figure 6C:
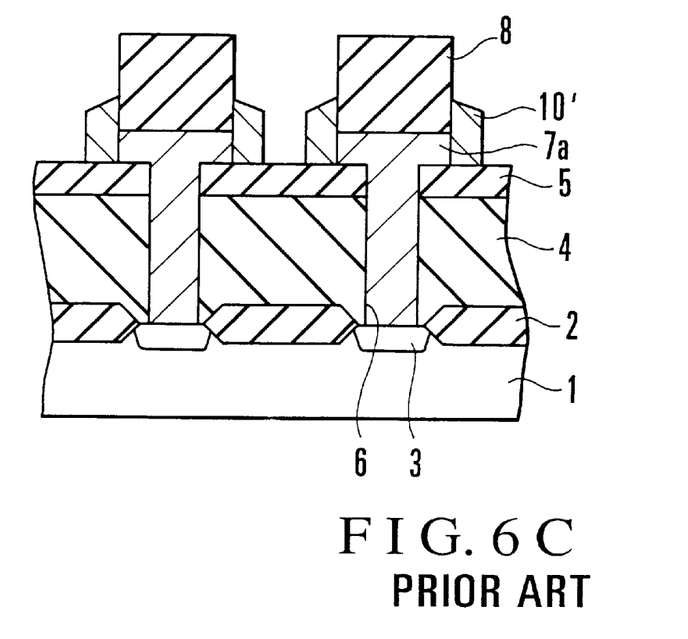
Figure 6D:
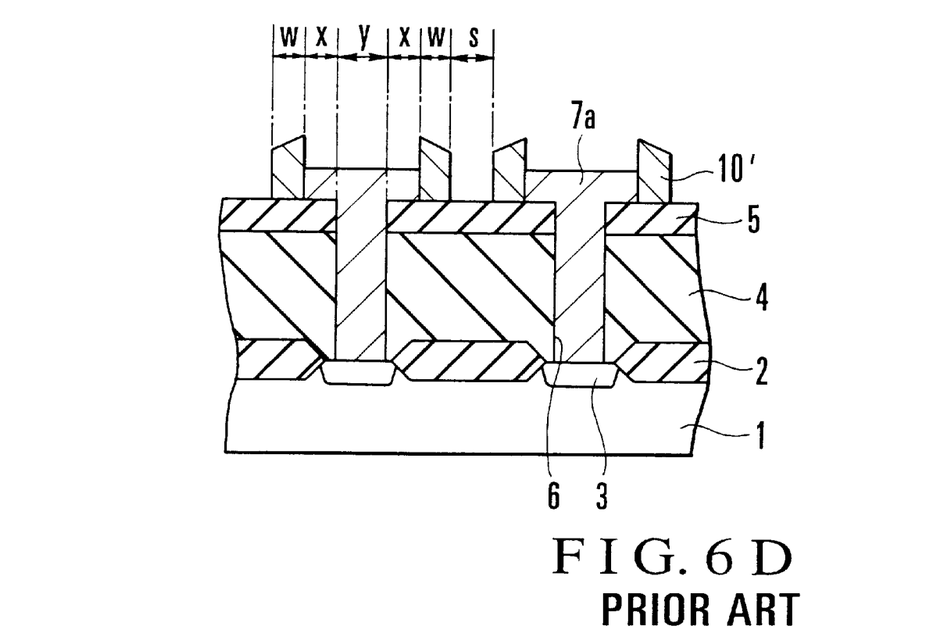

As shown in FIGS. 6B and 6C, the polysilicon film 10a on the upper surface of the BPSG film 8 is removed by anisotropic etching to leave the polysilicon film 10a only on the side surfaces of the polysilicon film 7a and the BPSG film 8, forming a side wall 10'. As shown in FIG. 6D, after the BPSG film 8 is removed, the polysilicon film 7a and the side wall 10' are rendered conductive by diffusing phosphorus therein, thereby forming the lower electrode of a capacitor.

A silicon nitride film is formed on the polysilicon film 7a and the side surface of the side wall 10' to form a capacitor insulating film (not shown). An upper electrode (not shown) serving as the counterelectrode of the capacitor is formed of polysilicon on the capacitor insulating film.

If the residue of the polysilicon film 10a remains on the silicon oxide film 5 upon anisotropically etching the polysilicon film 10a in order to form the side walls 10' in FIG. 6B, the capacitors of adjacent cells are short-circuited. For this reason, the etching time must be set long enough not to leave the residue of the polysilicon film 10a. The etching time is normally set about 50% longer than the time required to completely remove an etching target. Note that the ratio of the increase in etching time will be referred to as an over-etching ratio hereinafter.

If the polysilicon film 10a on the upper surface of the BPSG film 8 is removed, the etching rate of the polysilicon film 10a is increased by the microloading effect due to a decrease in occupying area ratio of the polysilicon film 10a with respect to the silicon substrate 1. For example, the etching rate, which is initially about 0.005 $\mu$m/sec, increases to about 0.015 $\mu$m/sec upon removing the polysilicon film 10a on the upper surface of the BPSG film 8. If an over-etching ratio of 50% is applied to the 0.2-$\mu$m thick polysilicon film 10a in this situation, the height of the side wall 10' becomes smaller than that of the BPSG film 8 by about 0.3 $\mu$m, as shown in FIG. 6C. If the side wall 10' becomes lower, the capacitor area decreases, resulting in a small cell capacity.

In the use of the cylinder-stacked capacitor, the cell size increases, compared to a case using a normal stacked capacitor. As shown in FIG. 6D, assuming the capacitor interval between adjacent cells is represented by s; the thickness of the side wall, w; the length from the end of the polysilicon film 7a to the connection hole 6, x; and the inner diameter of the connection hole 6, y, a short side length L1 of the cell having the cylinder-stacked capacitor is expressed by $$L1=s+2w+2x+y$$

To the contrary, a short side length L2 of the cell having the normal stacked capacitor is shorter due to the absence of the side wall 10', and expressed by $$L2=s+2x+y$$

In this case, the capacitor interval s and the inner diameter y of the connection hole 6 are determined by the resolution limitation of lithography, and the length x is determined by the alignment precision of lithography.

For example, according to the 0.4-$\mu$m design rule of a DRAM memory cell, since the capacitor interval s and the inner diameter y of the connection hole 6 are 0.4 $\mu$m, and the length x is 0.2 $\mu$m for a normal stacked cell, the short side length of the cell is 1.2 $\mu$m.

For a cylinder-stacked cell, the capacitor interval s can be set smaller than the resolution limitation value of lithography by the side wall thickness w. However, the adjacent cells must be sufficiently distant from each other so as to prevent short-circuiting therebetween, so that the lower limit of the capacitor interval s is about 0.25 $\mu$m. If the side wall thickness w is set too small, the side wall 10' falls down due to a low mechanical strength. Therefore, the lower limit of the side wall thickness w is about 0.15 $\mu$m. The length x and the inner diameter y of the connection hole 6 are respectively 0.2 $\mu$m and 0.4 $\mu$m as same as those of the normal stacked cell. Accordingly, the short side length of the cell is 1.35 $\mu$m, longer than that of the normal stacked cell.

That is, although the capacitor interval s of the cylinder-stacked cell can be set shorter than that of the normal stacked cell, the increase amount 2w of the thickness of the side wall 10' is larger than the decrease amount of the capacitor interval s. As a result, the size of the cylinder-stacked cell becomes larger than that of the normal stacked cell.

SUMMARY OF THE INVENTION

It is an object of the present invention to provide a method of manufacturing a semiconductor device in which the cell capacity is increased by increasing the height of the side wall of a memory cell with a cylinder-stacked structure.

It is another object of the present invention to provide a method of manufacturing a semiconductor device in which the integration degree is increased by reducing the cell size.

In order to achieve the above objects, according to the present invention, there is provided a method of manufacturing a semiconductor device, comprising the steps of forming a first insulating film on a semiconductor substrate, selectively forming a contact hole in the first insulating film, forming a first conductive film on the first insulating film to fill an interior of the contact hole with the first conductive film, forming a second insulating film on the first conductive film, forming a second conductive film on the second insulating film to be thicker than the first conductive film, patterning the second insulating film and the second conductive film to leave the second insulating film and the second conductive film only immediately above the contact hole, forming a third conductive film on surfaces of the first conductive film, the second insulating film, and the second conductive film, removing the third conductive film on the first and second conductive films by anisotropic etching to form a cylindrical lower electrode essentially consisting of the third conductive film left only on side surfaces of the second insulating film and the second conductive film, removing an exposed portion of the first conductive film and the second conductive film by anisotropic etching to expose the first and second insulating films, removing the second insulating film to expose the first conductive film, forming a third insulating film on a surface of the lower electrode and an exposed portion of the first conductive film, and forming a fourth conductive film serving as an upper electrode on the third insulating film to oppose the lower electrode.

DESCRIPTION OF THE PREFERRED EMBODIMENTS

Embodiments of the present invention will be described below with reference to the accompanying drawings.
(First Embodiment)

Figure 1A:
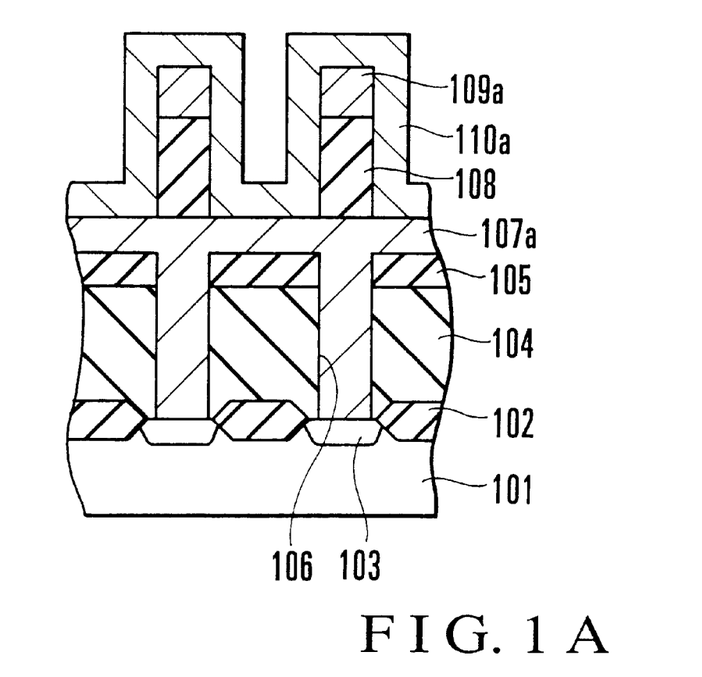
FIGS. 1A to 1D are sectional views, respectively, showing the steps in manufacturing a semiconductor device according to the first embodiment of the present invention.

FIGS. 1A to 1D show the respective steps in manufacturing a semiconductor device according to the first embodiment of the present invention. As shown in FIG. 1A, a 0.4-$\mu$m thick field oxide film 102 is formed on the surface of a p-type silicon substrate 101 by selective oxidation to partition active regions. A gate oxide film (not shown), a gate electrode (not shown), a source region 103, and a drain region (not shown) are formed in each active region to form a memory cell transistor with a known structure. Note that such a memory cell transistor with the known structure is disclosed in, e.g., Japanese Patent Laid-Open Nos. 62-48062 and 4-266060.

A 1-$\mu$m thick BPSG film 104 is formed on the silicon substrate 101 including the field oxide film 102, and a 0.2-$\mu$m thick silicon oxide film 105 is formed on the BPSG film 104 to form a two-layered insulating film structure constituted by the BPSG film 104 and the silicon oxide film 105. Using lithography and etching, a contact hole 106 about 0.4 $\mu$m square is formed in the BPSG film 104 and the silicon oxide film 105 to reach the source region 103. A 0.2-$\mu$m thick polysilicon film 107a is formed on the silicon oxide film 105 to fill the interior of the contact hole 106 with the polysilicon film 107a. A 0.4-$\mu$m thick BPSG film 108 is formed on the polysilicon film 107a, and a 0.35-$\mu$m thick polysilicon film 109a is formed on the BPSG film 108.

Using lithography and etching, the BPSG film 108 and the polysilicon film 109a are patterned to leave the BPSG film 108 and the polysilicon film 109a immediately above the through hole 106. At this time, the polysilicon film 107a is not patterned. A 0.2-$\mu$m thick polysilicon film 110a is formed on the surfaces of the polysilicon film 109a, the BPSG film 108, and the polysilicon film 107a. FIG. 1A shows a state wherein the polysilicon film 110a is formed.

Figure 1B:
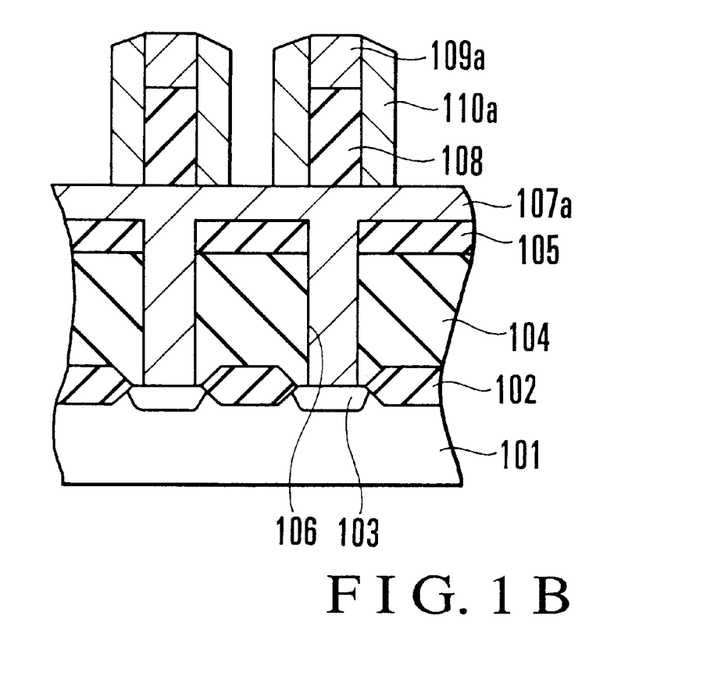
Figure 1C:
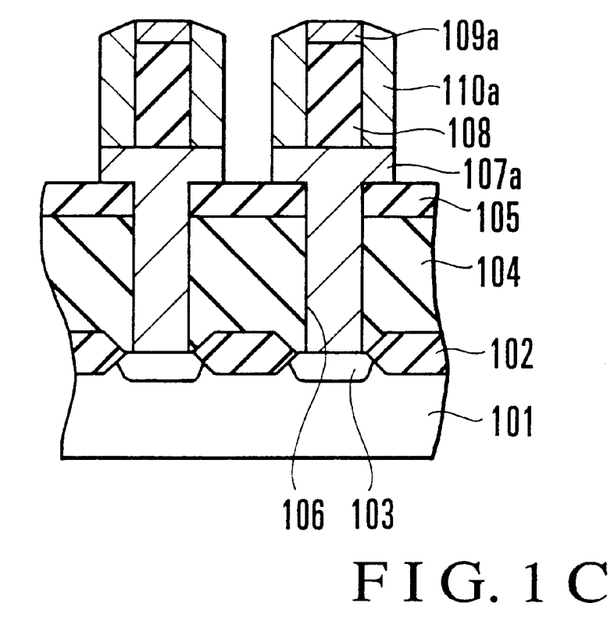
Figure 1D:
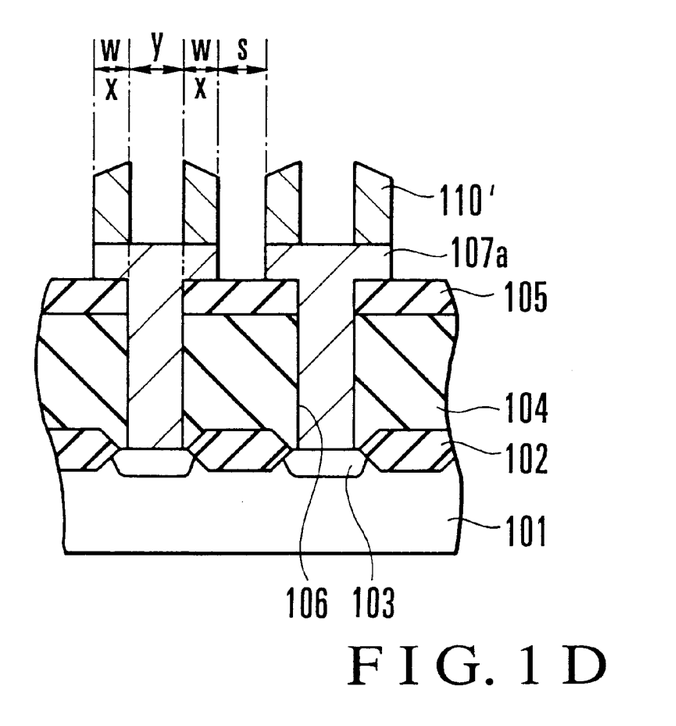

As shown in FIG. 1B, the polysilicon film 110a on the upper surface of the polysilicon film 109a and between cells is removed by anisotropic etching to leave the polysilicon film 110a only on the side surfaces of the BPSG film 108 and the polysilicon film 109a. As shown in FIG. 1C, anisotropic etching is further continuously performed to remove the polysilicon film 109a, forming a side wall 110' (FIG. 1D). As this time, the height of the polysilicon film 110a as the side wall 110' decreases also. To prevent short-circuiting between the capacitors of adjacent cells, the polysilicon film 107a formed between adjacent side walls 110' is completely removed. The side surface of the polysilicon film 107a and the outer side surface of the side wall 110' are substantially flush with each other.

As shown in FIG. 1D, after the BPSG film 108 is removed, the polysilicon film 107a and the side wall 110' are rendered conductive by diffusing phosphorus therein, thereby forming the lower electrode of the capacitor.

Figure 5:
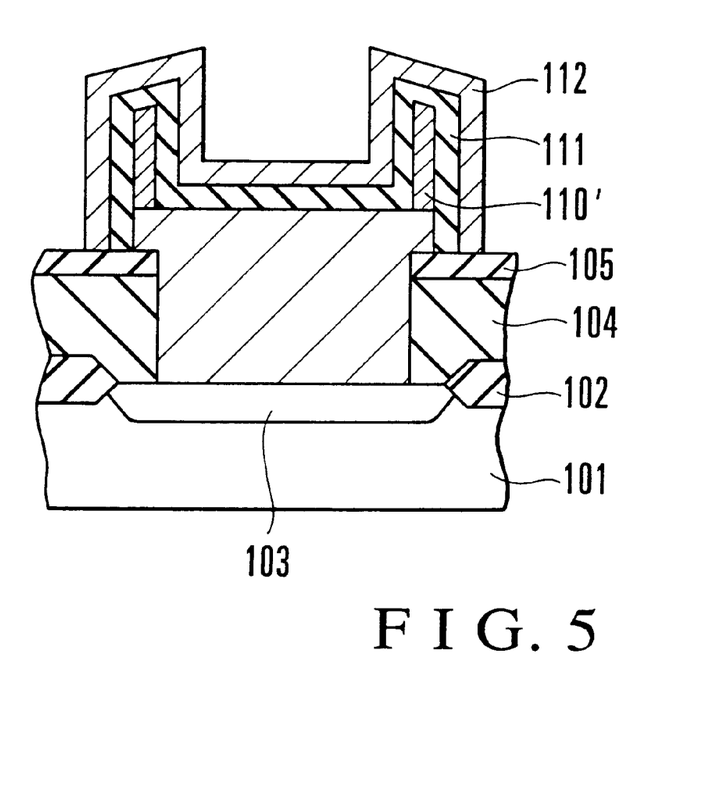
FIG. 5 is an enlarged sectional view of the main part of a semiconductor device manufactured by the present invention.

A silicon nitride film 111 is formed on the side and upper surfaces of the side wall 110' and the polysilicon film 107a to form a capacitor insulating film (dielectric layer). An upper electrode 112 serving as a counterelectrode is formed of polysilicon on the silicon nitride film 111, thereby completing a semiconductor device shown in FIG. 5.

A decrease in height of the side wall 110' when the present invention is practiced under the same conditions as those of the prior art is obtained. In FIG. 1A, an over-etching ratio of 50% is applied to the 0.4-$\mu$m thick two-layered structure constituted by the polysilicon film 107a and the polysilicon film 110a formed between the adjacent capacitors. Since the initial etching rate of the polysilicon film 107a and the polysilicon film 110a is 0.005 $\mu$m/sec, the over-etching time is 40 sec.

When the polysilicon film 107a is completely removed, the polysilicon film 109a remains by 0.15 $\mu$m (=0.35–0.2), as shown in FIG. 1C. For this reason, the etching rate does not increase for the next 30 sec until the polysilicon film 109a is removed. When the polysilicon film 109a is removed, the etching rate changes to 0.015 $\mu$m/sec. Upon over-etching for 10 sec, the height of the side wall 110' decreases by 0.15 $\mu$m. Since the height of the side wall 10' decreases by 0.3 $\mu$m in the prior art, the decrease in height of the side wall 110' can be suppressed by 0.15 $\mu$m in the present invention.

Figure 2A:
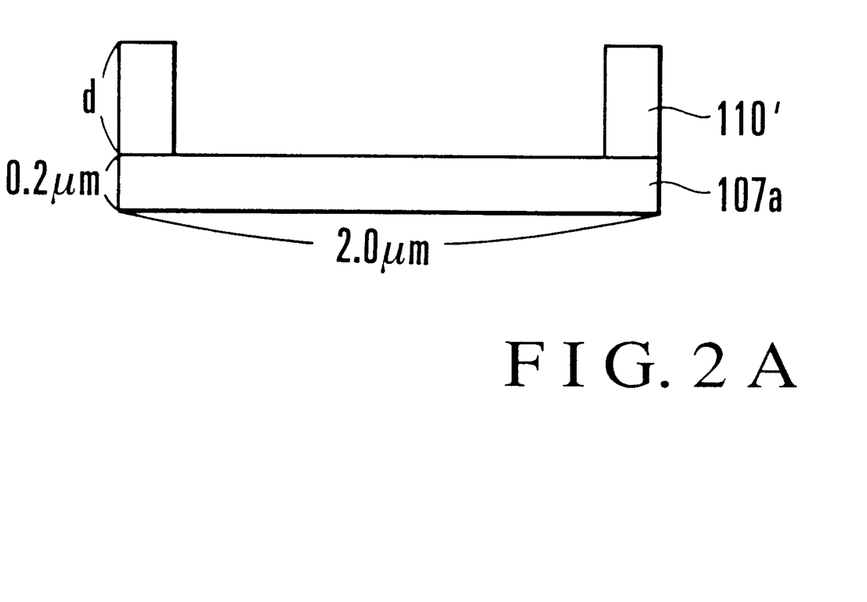
FIGS. 2A and 2B are a sectional view and a plan view of a cylinder-stacked capacitor for estimating the capacitor area, respectively.
Figure 2B:
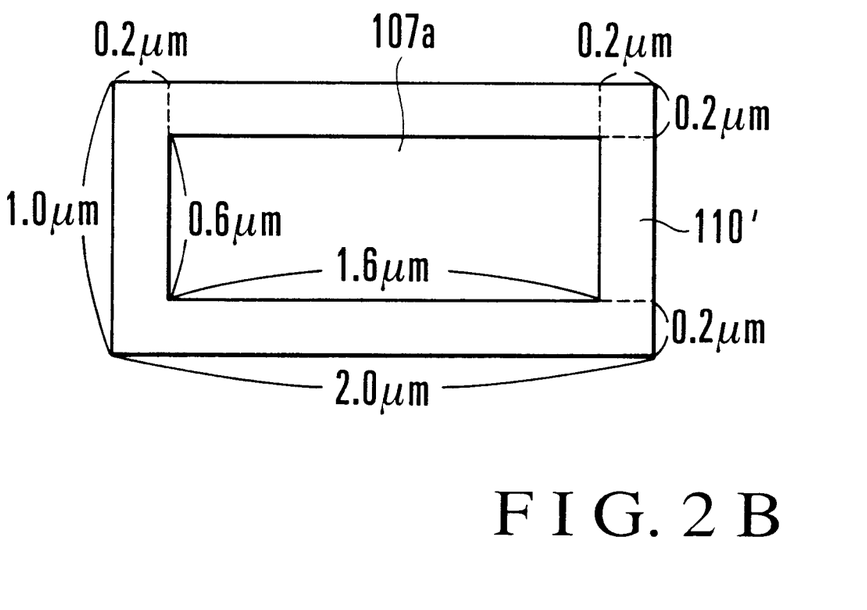

The influence of the height of the side wall 110' on the cell capacity is estimated by calculating the capacitor area. The shape and size of the lower electrode of the capacitor are approximated, as shown in a sectional view of FIG. 2A and a plan view of FIG. 2B. Portions which contribute to the capacity are the inner side surface, outer side surface, upper end face, and bottom surface (exposed portion of the upper surface of the polysilicon film 107a) of the side wall 110' including the polysilicon film 107a. Assuming the height of the side wall 110' is d $\mu$m, the area of the inner side surface is 4.4d (=1.6×d×2+0.6×d×2) $\mu$m$^2$, and the area of the outer side surface is 6d+1.2 (=2.0×d×2+1.0×d×2+2.0×0.2×2+1.0× 0.2×2) $\mu$m$^2$. A total of the area of the upper end face of the side wall 110' and the area of the exposed portion of the upper surface of the polysilicon film 107a is 2 $\mu$m$^2$. Therefore, the above areas are added to obtain a capacitor area of (10.4d+3.2) $\mu$m$^2$.

In the prior art, when the thickness of the BPSG film is set at 0.4 $\mu$m, d=0.1 because the height d of the side wall 10' is lowered by 0.3 $\mu$m from the surface of the BPSG film 8, resulting in a capacitor area of 4.24 (=10.4×0.1+3.2) $\mu$m$^2$. In the present invention, d=0.25 because the decrease in height d of the side wall 110' with respect to the surface of the BPSG film 108 can be suppressed to 0.15 $\mu$m, resulting in a capacitor area of 5.8 (=10.4×0.25+3.2) $\mu$m$^2$. Therefore, the capacitor area in the present invention is 1.37 times (=5.8/4.24) larger than the conventional capacitor area, and the cell capacity also increases in proportion to the capacitor area.

The short side length of the cell is calculated. Since the polysilicon film 107a is patterned at the same time of formation of the side wall 110', the annular side wall 110' is formed at the peripheral edge portion of the polysilicon film 107a, as shown in FIG. 1D. The side surface of the polysilicon film 107a and the outer side surface of the side wall 110' are substantially flush with each other. That is, since the thickness w of the side wall 110' is included in the length x from the end of the polysilicon film 107a to the contact hole 106, the short side length of the cell can be set smaller than the conventional length by two times the side wall thickness w. Therefore, the short side length L of the cell can be expressed by L=s+2x+y According to the 0.4-$\mu$m design rule of the DRAM memory cell, since the capacitor interval s is 0.25 $\mu$m, the length x is 0.2 $\mu$m, and the inner diameter y of the contact hole 106 is 0.4 $\mu$m, similar to the case using the conventional technique, the short side length L of the cell is 1.05 (=0.25+2×0.2+0.4) $\mu$m. Therefore, according to the present invention, the cell size can be set smaller than that of the cylinder-stacked cell manufactured by the conventional technique, and that of the normal stacked cell.

(Second Embodiment)

Figure 3A:
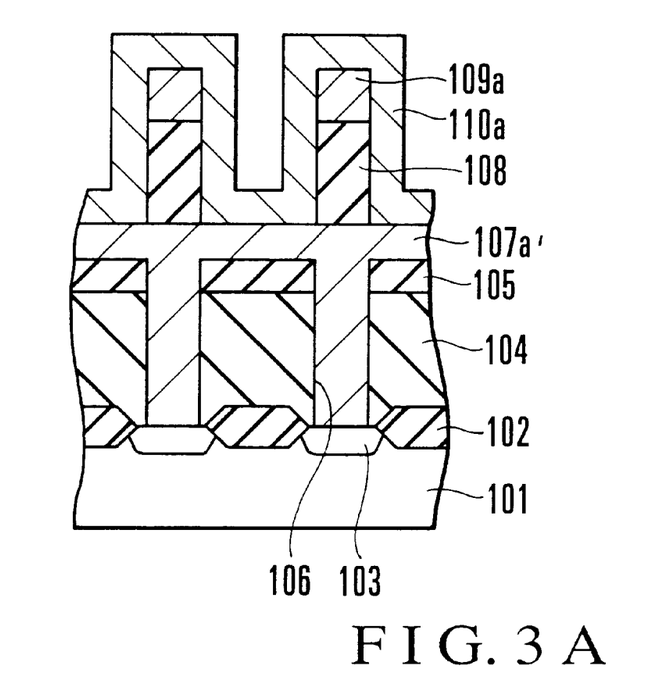
FIGS. 3A to 3C are sectional views, respectively, showing the steps in manufacturing a semiconductor device according to the second embodiment of the present invention.
Figure 3B:
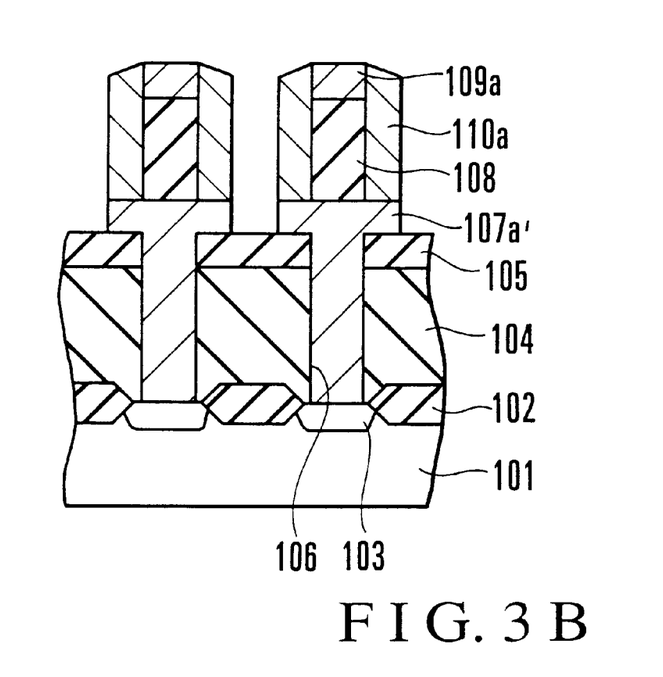
Figure 3C:
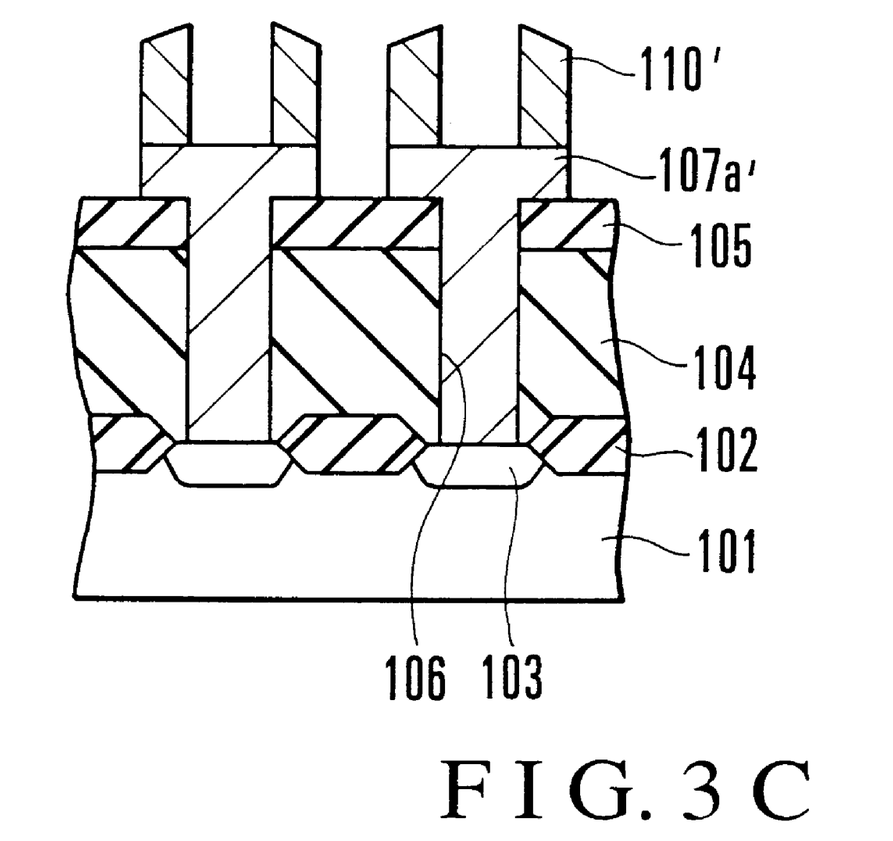

FIGS. 3A to 3C show the respective steps in manufacturing a semiconductor device according to the second embodiment of the present invention. The process up to formation of a contact hole 106 is the same as in the first embodiment, and a description thereof will be omitted.

As shown in FIG. 3A, after the contact hole 106 is formed, a 0.2-$\mu$m thick polysilicon film 107a' having a phosphorus concentration of 1×10$^{20}$ cm$^{-3}$ is formed on a silicon oxide film 105 to fill the interior of the contact hole 106 with the polysilicon film 107a'. A 0.4-$\mu$m thick BPSG film 108 is formed on the polysilicon film 107a', and a 0.35-$\mu$m thick polysilicon film 109a undoped with phosphorus is formed on the BPSG film 108.

Using lithography and etching, the BPSG film 108 and the polysilicon film 109a are patterned to leave the BPSG film 108 and the polysilicon film 109a immediately above the contact hole 106. At this time, the polysilicon film 107a' is not patterned. A 0.2-$\mu$m thick polysilicon film 110a undoped with phosphorus is formed on the surfaces of the BPSG film 108, the polysilicon film 109a, and the polysilicon film 107a'. FIG. 3A shows a state wherein the polysilicon film 110a is formed.

The polysilicon film 110a on the polysilicon film 109a and between cells is removed by anisotropic etching to leave the polysilicon film 110a only on the side surfaces of the BPSG film 108 and the polysilicon film 109a. Anisotropic etching is further continuously performed to remove the polysilicon film 109a, forming a side wall 110' (FIG. 3C). To prevent short-circuiting between the capacitors of adjacent cells, the polysilicon film 107a' between the cells is completely removed, as shown in FIG. 3B. At this time, the side surface of the polysilicon film 107a' and the outer side surface of the side wall 110' are substantially flush with each other.

As shown in FIG. 3C, after the BPSG film 108 is removed, the side wall 110' is rendered conductive by diffusing phosphorus therein to form the lower electrode of the capacitor, together with phosphorus-doped polysilicon film 107a'. A silicon nitride film 111 is formed on the side wall 110', the polysilicon film 107a', and the silicon oxide film 105 to form a capacitor insulating film. An upper electrode 112 serving as the counterelectrode of the capacitor is formed of polysilicon on the silicon nitride film 111, thereby completing a semiconductor device shown in FIG. 5.

If phosphorus is doped in the polysilicon film, the etching rate becomes about 20% higher than that used when no phosphorus is doped in the polysilicon film. In the step of etching the polysilicon film 107a' and the polysilicon film 110a formed between the adjacent capacitors, the polysilicon film 109a upon completely removing the polysilicon film 107a' is thicker than that in the first embodiment, as shown in FIG. 3B. Therefore, if the same etching time as that in the first embodiment is employed, the over-etching ratio can be increased without changing the height d of the side wall 110', i.e., the decrease amount of the height d. As a result, short-circuiting due to the presence of residue of the polysilicon film hardly occurs between adjacent cells.

(Third Embodiment)

Figure 4A:
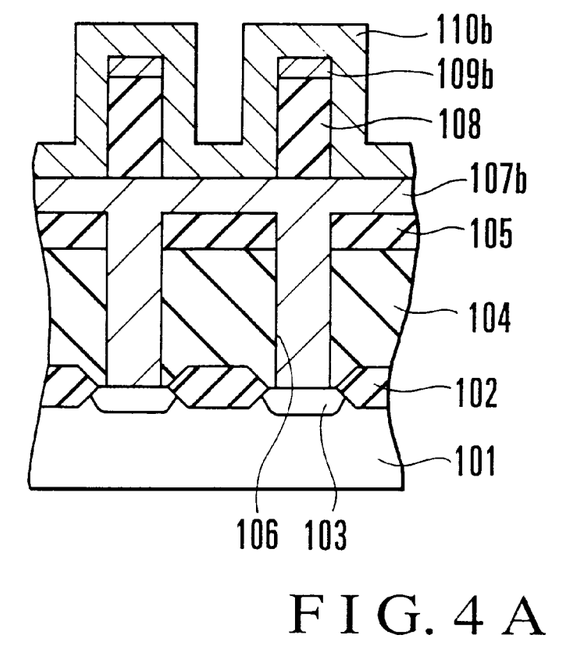
FIGS. 4A to 4C are sectional views, respectively, showing the steps in manufacturing a semiconductor device according to the third embodiment of the present invention.
Figure 4B:
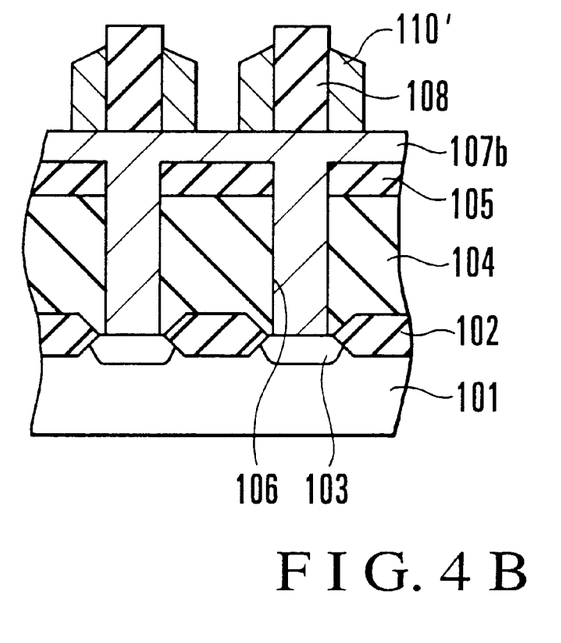
Figure 4C:
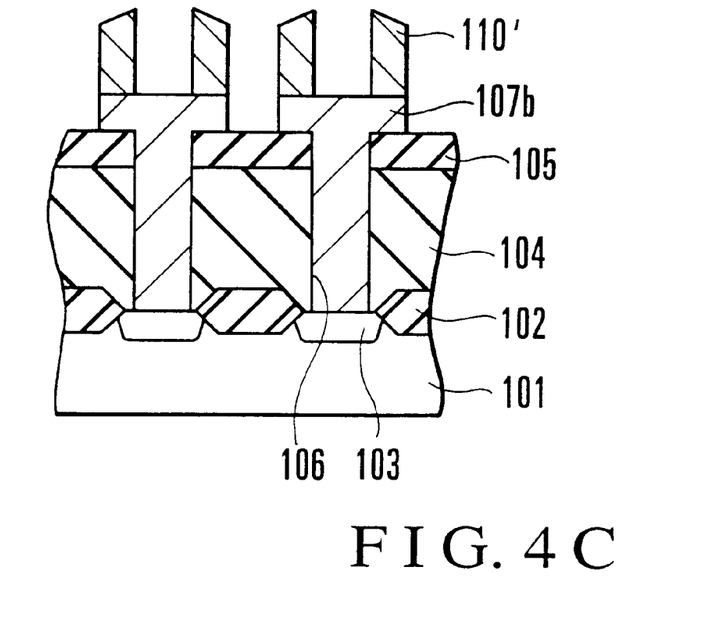

FIGS. 4A to 4C show the respective steps of manufacturing a semiconductor device according to the third embodiment of the present invention. The process up to formation of a contact hole 106 is the same as in the first embodiment, and a description thereof will be omitted.

As shown in FIG. 4A, after the contact hole 106 is formed, a 0.2-$\mu$m thick titanium nitride film 107b is formed on a silicon oxide film 105 to fill the interior of the contact hole 106 with the titanium nitride film 107b. A 0.4-$\mu$m thick BPSG film 108 is formed on the titanium nitride film 107b, and a 0.05-$\mu$m thick tungsten film 109b is formed on the BPSG film 108. Using lithography and etching, the BPSG film 108 and the tungsten film 109b are patterned to leave the BPSG film 108 and the tungsten film 109b immediately above the contact hole 106. At this time, the titanium nitride film 107b is not patterned. A 0.2-$\mu$m thick tungsten film 110b is formed on the surfaces of the BPSG film 108, the tungsten film 109b, and the titanium nitride film 107b. FIG. 4A shows a state wherein the tungsten film 110b is formed.

The tungsten film 110b on the tungsten film 109b is removed by anisotropic etching to leave the tungsten film 110b only on the side surfaces of the BPSG film 108 and the tungsten film 109b. As shown in FIG. 4B, anisotropic etching is further continuously performed to remove the tungsten film 109b, forming a side wall 110' (FIG. 4C), and the tungsten film 110b formed between adjacent cells is completely removed. Note that proper anisotropic etching is reactive ion etching (RIE) using a fluorine-based etching gas, and the like.

To prevent short-circuiting between the capacitors of the adjacent cells, the titanium nitride film 107b between the cells is completely removed by anisotropic etching. If RIE using a chlorine-based etching gas is used as anisotropic etching, the decrease in height of the side wall 110' can be suppressed upon over-etching the titanium nitride film 107b because the etching rate of the tungsten film 110b is about ½₀₀ that of the titanium nitride film 107b. At this time, the side surface of the titanium nitride film 107b and the outer side surface of the side wall 110' are substantially flush with each other.

As shown in FIG. 4C, after the BPSG film 108 is removed, the lower electrode of the capacitor is formed of the side wall 110' and the titanium nitride film 107b. A silicon nitride film 111 is formed on the side wall 110', the titanium nitride film 107b, and the silicon oxide film 105 to form a capacitor insulating film. An upper electrode 112 serving as the counterelectrode of the capacitor is formed of polysilicon on the silicon nitride film 111, thereby completing a semiconductor device shown in FIG. 5.

In the first to third embodiments, the respective films are formed by CVD. A silicate glass film doped with boron or phosphorus may be used in place of the BPSG film 108.

As has been described above, according to the present invention, since the decrease in height of the side wall can be suppressed, the capacitor area can be widened to increase the cell capacity. In addition, since the cell size can be reduced, the integration degree can be increased.

What is claimed is:

1. A method of manufacturing a semiconductor device, comprising the steps of:

forming a first insulating film on a semiconductor substrate;

selectively forming a contact hole in said first insulating film;

forming a first conductive film on said first insulating film to fill an interior of the contact hole with said first conductive film;

forming a second insulating film on said first conductive film;

forming a second conductive film on said second insulating film to be thicker than said first conductive film;

patterning said second insulating film and said second conductive film to leave said second insulating film and said second conductive film only immediately above the contact hole;

forming a third conductive film on surfaces of said first conductive film, said second insulating film, and said second conductive film;

removing said third conductive film on said first and second conductive films by anisotropic etching to form a cylindrical lower electrode essentially consisting of said third conductive film left only on side surfaces of said second insulating film and said second conductive film;

removing an exposed portion of said first conductive film and said second conductive film by anisotropic etching to expose said first and second insulating films;

removing said second insulating film to expose said first conductive film;

forming a third insulating film on a surface of said lower electrode and an exposed portion of said first conductive film; and forming a fourth conductive film serving as an upper electrode on said third insulating film to oppose said lower electrode.

2. A method according to claim 1, wherein said first conductive film is constituted by polysilicon containing an impurity, and said second and third conductive films are constituted by polysilicon containing no impurity.

3. A method according to claim 1, wherein the step of removing the exposed portion of said first conductive film and said second conductive film includes the step of performing over-etching after removing said second conductive film.

4. A method according to claim 1, wherein the step of removing said third conductive film, and the step of removing the exposed portion of said first conductive film and said second conductive film are constituted by a single step of continuously performing anisotropic etching.

5. A method of manufacturing a semiconductor device, comprising the steps of:

forming a first insulating film on a semiconductor substrate;

selectively forming a contact hole in said first insulating film;

forming a first conductive film essentially consisting of a first conductive material on said first insulating film to fill an interior of the contact hole with said first conductive film;

forming a second insulating film on said first conductive film;

forming, on said second insulating film, a second conductive film essentially consisting of a second conductive material having an etching rate lower than that of the first conductive material;

patterning said second insulating film and said second conductive film to leave said second insulating film and said second conductive film only immediately above the contact hole;

forming a third conductive film essentially consisting of a third conductive material having almost the same etching rate as that of the second conductive material, on surfaces of said first conductive film, said second insulating film, and said second conductive film;

removing said third conductive film on said first and second conductive films by anisotropic etching to form a cylindrical lower electrode consisting of said third conductive film left only on side surfaces of said second insulating film and said second conductive film;

removing said second conductive film by anisotropic etching to expose said second insulating film;

removing an exposed portion of said first conductive film by anisotropic etching to expose said first insulating film;

removing said second insulating film to expose said first conductive film;

forming a third insulating film serving as a dielectric layer on a surface of said lower electrode and an exposed portion of said first conductive film; and forming a fourth conductive film serving as an upper electrode on said third insulating film to oppose said lower electrode.

6. A method according to claim 5, wherein the etching rate of the second conductive material is set not more than 1/10 that of the first conductive material.

7. A method according to claim 5, wherein the first conductive material is titanium nitride, and the second and third conductive materials are tungsten.

8. A method according to claim 5, wherein the step of removing said third conductive film, the step of removing said second conductive film, and the step of removing the exposed portion of said first conductive film are constituted by a single step of continuously performing anisotropic etching.

* * * * *